United States Patent
Asayama et al.

(10) Patent No.: US 6,641,888 B2
(45) Date of Patent: Nov. 4, 2003

(54) SILICON SINGLE CRYSTAL, SILICON WAFER, AND EPITAXIAL WAFER.

(75) Inventors: Eiichi Asayama, Saga (JP); Masataka Horai, Saga (JP); Shigeru Umeno, Sasebo (JP); Shinsuke Sadamitsu, Saga (JP); Yasuo Koike, Kashima (JP); Kouji Sueoka, Amagasaki (JP); Hisashi Katahama, Saga (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 29 days.

(21) Appl. No.: 10/055,340

(22) Filed: Jan. 25, 2002

(65) Prior Publication Data

US 2002/0142171 A1 Oct. 3, 2002

Related U.S. Application Data

(62) Division of application No. 09/362,216, filed on Jul. 28, 1999, now abandoned.

(30) Foreign Application Priority Data

Mar. 26, 1999 (JP) ............................................. 11-083424

(51) Int. Cl.$^7$ ............................................. C30B 29/06
(52) U.S. Cl. ...................... 428/64.1; 428/446; 423/348; 117/928
(58) Field of Search ................................ 428/446, 64.1; 423/348; 117/928, 2, 3

(56) References Cited

U.S. PATENT DOCUMENTS

| | | | |
|---|---|---|---|
| 4,591,409 A | 5/1986 | Ziem et al. | 156/605 |
| 4,637,855 A | 1/1987 | Witter et al. | |
| 5,841,532 A | 11/1998 | Yoshida et al. | 356/318 |
| 5,935,320 A | 8/1999 | Graef et al. | 117/2 |
| 6,059,875 A | 5/2000 | Kirkland et al. | 117/13 |
| 6,077,343 A | 6/2000 | Iida et al. | 117/2 |
| 6,090,645 A | 7/2000 | Hamada | 438/143 |
| 6,117,231 A | 9/2000 | Fusegawa et al. | 117/30 |
| 6,162,708 A | 12/2000 | Tamatsuka et al. | 438/503 |
| 6,191,009 B1 | 2/2001 | Tamatsuka et al. | 438/471 |

FOREIGN PATENT DOCUMENTS

| | | |
|---|---|---|
| JP | 60-251190 | 12/1985 |
| JP | 61-17495 | 1/1986 |
| JP | 63-198334 | 8/1988 |
| JP | 63-227026 | 9/1988 |
| JP | 403003244 A | 1/1991 |
| JP | 3-50186 | 3/1991 |
| JP | 405251358 A | 9/1993 |
| JP | 5-294780 | 11/1993 |
| JP | 406104199 A | 4/1994 |
| JP | 406194199 A | 4/1994 |
| JP | 6-271399 | 9/1994 |
| JP | 08-091993 | 4/1996 |
| JP | 8-250506 | 9/1996 |
| JP | 10-098047 | 4/1998 |
| JP | 10-229093 | 8/1998 |
| JP | 411130592 | 5/1999 |
| JP | 11-189493 | 7/1999 |

*Primary Examiner*—Deborah Jones
*Assistant Examiner*—Stephen Stein
(74) *Attorney, Agent, or Firm*—Armstrong, Westerman & Hattori, LLP (57) ABSTRACT

There are provided silicon single crystal, silicon wafer, and epitaxial wafer having a sufficient gettering effect suitable for a large-scale integrated device. The silicon single crystal which is suitable for an epitaxial wafer is grown with nitrogen doping at a concentration of $1 \times 10^{13}$ atoms/cm$^3$ or more, or with nitrogen doping at a concentration of $1 \times 10^{12}$ atoms/cm$^3$ and carbon doping at a concentration of $0.1 \times 10^{16} - 5 \times 10^{16}$ atoms/cm$^3$ and/or boron doping at a concentration of $1 \times 10^{17}$ atoms/cm$^3$ or more. The silicon wafer is produced by slicing from the silicon single crystal, and an epitaxial layer is grown on a surface of the silicon wafer to produce the epitaxial wafer. The present invention provides an epitaxial wafer for a large-scale integrated device having no defects in a device-active region and having an excellent gettering effect without performance of an extrinsic or intrinsic gettering treatment.

12 Claims, 8 Drawing Sheets

—■— Doped at $10^{12}$ atoms/cm$^3$
—●— Doped at $10^{13}$ atoms/cm$^3$
—▲— Doped at $10^{14}$ atoms/cm$^3$

\* ×    Immediately After Formation of Epitaxial Layer

—■—   Nitrongen-Non-Doped p/p−

—●—   Nitrongen-Non-Doped p/p+

—✢—   p/p− Doped at $10^{12}$ atoms/cm$^3$

—⊠—   p/p+ Doped at $10^{12}$ atoms/cm$^3$

—□—   p/p− Doped at $10^{13}$ atoms/cm$^3$

—○—   p/p+ Doped at $10^{13}$ atoms/cm$^3$

—△—   p/p− Doped at $10^{14}$ atoms/cm$^3$

—◇—   p/p+ Doped at $10^{14}$ atoms/cm$^3$

Fig. 8

SILICON SINGLE CRYSTAL, SILICON WAFER, AND EPITAXIAL WAFER.

This application is a division of prior application Ser. No. 09/362.216 filed Jul. 28, 1999 now abandoned, which is hereby incorporated by reference.

FIELD OF THE INVENTION

The present invention relates to a silicon single crystal used for a semiconductor integrated circuit device and to a silicon wafer and an epitaxial wafer, which are obtained therefrom and used for forming an integrated circuit. More particularly, the present invention relates to a silicon single crystal, a silicon wafer, and an epitaxial wafer exhibiting high gettering capability which is provided by doping with nitrogen solely, or with nitrogen and carbon and/or boron during growth of a single crystal and without provision of an additional step.

DESCRIPTION OF THE PRIOR ART

As the integration density of silicon semiconductor integrated circuit devices rapidly increases, a silicon wafer from which devices are formed is subjected to increasingly severe specifications. Thus, since circuits are made thinner with increasing integration density within a device active region wherein a device is formed on a wafer, crystal defects, such as dislocations and elemental metal impurities other than a dopant, which increase leakage current and shorten the life of a carrier are subjected to more rigorous limitations than ever before.

Conventionally, a wafer produced by slicing a silicon single crystal obtained through the Czochralski method has been used for a semiconductor device. Generally, the wafer contains oxygen at a concentration of about $10^{18}$ atoms/cm$^3$. Although oxygen is effective for enhancing the strength of a silicon wafer by preventing generation of dislocations and for providing a gettering effect, oxygen is well known to deposit in the form of an oxide and to induce crystal defects such as dislocation or a stacking fault caused by heating during production of a device. However, in a process of device production, a defect-free DZ layer (denuded zone) having a thickness of about 10 μm is formed near the wafer surface by diffusion of oxygen to the outside, since the wafer is maintained at a temperature as high as 1100–1200° C. for several hours so as to form a field oxide film through LOCOS (Local Oxidation of Silicon) and a well diffusion layer. The denuded zone serves as a device active region, to thereby provide a reduction in crystal defects.

However, in conjunction with the increasing density of integration, a high-energy ion implantation method has been employed for forming a well, and a device has been produced at a temperature of 1000° C. or less. Therefore, oxygen diffuses slowly, and formation of the above-mentioned denuded zone is insufficient. Even though reduction of oxygen content in a substrate has been attempted, crystal defects are insufficiently suppressed and the performance of a wafer is deteriorated by the reduction in oxygen content. Thus, attempts to reduce oxygen content have yielded unsatisfactory results. Therefore, an epitaxial wafer wherein a silicon epitaxial layer containing substantially no crystal defects has been formed on a silicon slice serving as a wafer substrate has been developed and is widely used for a large-scale integrated device.

Thus, feasibility of complete prevention of crystal defects in a device active region on a wafer can be enhanced by employment of an epitaxial wafer. However, contamination with elemental metal impurities exerts a strong influence, because a complicated process is required for realizing high-density integration and contamination occurs frequently. Although purification of the production environment and raw materials is essential for preventing contamination, complete prevention of contamination in the process of producing the device is difficult. Therefore, gettering is employed. Gettering is a method in which impurity elements provided through contamination are collected outside the device active region so as to eliminate negative influences.

Elemental metal impurities diffuse into a silicon crystal at a relatively low temperature, to thereby form a solid solution, and generally diffuse in silicon at high speed. When crystal defects such as dislocation and distortion caused by fine deposits occur, the impurities tend to concentrate to the defects, in order to attain a more stable energy state than that in the case where impurities exist in the crystal lattice. Therefore, a crystal defect is intentionally introduced to thereby capture and confine impurities. The site where the impurities are captured is called a sink. Sinks are produced by two types of gettering methods; i.e., extrinsic gettering and intrinsic gettering.

Extrinsic gettering is a method in which crystal defects are introduced by means of distortion induced by extrinsic factors such as sandblasting, polishing, laser radiation, ion implantation, and growth of $Si_3N_4$ film or polycrystalline Si film; whereas intrinsic gettering is a method in which a number of micro-defects, which are probably induced by oxygen while a wafer obtained through the Czochralski process involving oxygen is alternately subjected to high-temperature heat treatment and low-temperature heat treatment, are employed as sinks.

Of the above-mentioned gettering techniques, extrinsic gettering represented by imparting distortion to a reverse side of a wafer involves drawbacks such as an increase in production costs due to addition of production steps; generation of particles due to detachment of silicon chips from a portion imparted with distortion; and warp of a wafer resulting from the treatment.

In intrinsic gettering, heat treatment is required for effective production of sinks, and therefore intrinsic gettering requires additional steps. Furthermore, in an epitaxial wafer substrate, oxide precipitates which are to serve as nuclei of micro-defects shrink to disappear due to employment of a temperature as high as 1050–1200° C. during a step for forming an epitaxial layer, to thereby disturb subsequent formation of sinks during heat treatment. Particularly, as mentioned above, when a device process is carried out at relatively low temperature, the growth rate of oxide precipitates decreases to disadvantageously result in an insufficient gettering effect to metal impurities at an initial stage of the device process as well as during the entire course of the step.

To overcome these drawbacks, there has been a method employed in which a wafer is thermally treated before and after an epitaxial process in order to intentionally generate crystal defects which getter impurities. Conventionally, a number of gettering methods have been proposed. However, other drawbacks remain, such as a long-duration heat treatment and complex processing steps.

For example, Japanese Patent Application Laid-Open (kokai) No. 3-50186 discloses a method in which a heat treatment is carried out at 750–900° C. before an epitaxial process to thereby ensure generation of oxide precipitates. Although the specific temperature for the heat treatment is not specified, based on assumptions that follow from the description, the heat treatment might be required for as long as four hours or more. Japanese Patent Application Laid-Open (kokai) No. 8-250506 discloses a method in which one-step or two-step annealing at low temperature is carried out; the annealed wafer is maintained within a medium temperature range; and subsequently epitaxial growth is carried out. Furthermore, Japanese Patent Application Laid-Open (kokai) No. 10-229093 discloses a method comprising treating a wafer sliced from a crystal doped with carbon at a concentration of $0.3 \times 10^{16}$ to $2.5 \times 10^{16}$ atoms/cm$^3$ at 600–900° C. for 15 minutes to four hours; polishing one or both surfaces of the wafer; and carrying out epitaxial growth.

With regard to a heat treatment after an epitaxial process, Japanese Patent Application Laid-Open (kokai) No. 63-198334 discloses a method in which annealing is carried out at 650–900° C. for as long as 4–20 hours, or stepwise temperature elevation between 650° C. and 900° C. is carried out after an epitaxial process to thereby ensure generation of oxide precipitates. Japanese Patent Application Laid-Open (kokai) No. 63-227026 discloses a method in which carbon is doped at a high concentration while a crystal is being pulled; epitaxial growth is carried out; and two-step heat treatment i.e., low temperature annealing and medium temperature annealing, is carried out to thereby ensure generation of oxide precipitates. The method also requires a heat treatment of eight hours or longer.

As described hereinabove, a heat treatment carried out before and after an epitaxial process may introduce problems, such as decrease in productivity and increase in costs due to an increase in the number of steps; damage to a boat during the treatment; and a reduction in yield due to particle generation. Moreover, since a variety of device processes are carried out after an epitaxial process and the history of the heat treatment of a wafer varies in accordance with the device processes, formation of oxide precipitates, growth of the precipitates, and gettering capability induced thereby also vary. Therefore, heat treatment conditions must be selected in accordance with the device processes.

SUMMARY OF THE INVENTION

To overcome the above drawbacks involved in production of a silicon single crystal, a silicon wafer, and an epitaxial wafer, an object of the present invention is to provide a silicon single crystal characterized in that precipitates which are not extinguished even during a high-temperature epitaxial process are formed therein without performance of extrinsic or intrinsic gettering treatment, which is a factor for increasing costs, and in that a gettering effect thereof is stable during any subsequent device process involving any temperature profile. Another object of the present invention is to provide a silicon wafer obtained from the silicon single crystal. Still another object of the present invention is to provide an epitaxial wafer produced from the silicon wafer.

Oxidation-induced stacking fault (hereinafter referred to as simply "OSF") is one type of fine crystal defect attributed to contained oxygen. OSF is a stacking fault generated in a crystal under an oxide film during a high-temperature oxidation treatment in a device process. Generation of OSF exhibits positive correlation with the content of oxygen in a Si crystal. The defect is grown from oxide precipitates serving as growth nuclei. When a Si single crystal wafer produced through the Czochralski method is treated at 1000–1200° C. for 1–20 hours, ring-like distributed oxidation-induced stacking faults (hereinafter referred to as "OSF rings") may be generated around the axis along which the single crystal is pulled. The present inventors have found that a Si epitaxial layer is formed on a substrate including OSF rings and that oxide deposits within a ring region function as effective gettering sites without being extinguished during a production step of a device performed after epitaxial growth.

In general, an OSF ring has a width of some mm to some tens of mm and a boundary between an OSF ring and an adjacent region is distinctly defined. When a crystal is pulled at a high pulling speed, the diameter of the ring increases to approximately the outer diameter of a wafer, whereas when the pulling speed is reduced, the OSF rings are gradually reduced in diameter and eventually extinguished.

In consideration of the gettering effect induced by crystal defects in an OSF ring region, the present inventors have conducted a variety of studies directed toward conditions that increase the width of an OSF ring, and have found that doping of nitrogen during Czochralski growth of a single crystal increases the width of the ring. Thus, when the entire surface of a wafer serves as an OSF region, nuclei of precipitates that are difficult to extinguish during an epitaxial process and stable at high temperature effectively function as gettering sites.

Effects of nitrogen doping during Czochralski growth of a single crystal have conventionally been known. For example, Japanese Patent Application Laid-Open (kokai) No. 61-17495 discloses an effect for strengthening a crystal; Japanese Patent Application Laid-Open (kokai) No. 60-251190 discloses an effect for preventing generation and movement of dislocation induced by thermal stress; and Japanese Patent Application Laid-Open (kokai) No. 5-294780 discloses an effect for preventing generation of etch pits in a wafer and a decrease in gate oxide integrity of a device. However, such disclosed methods are directed toward preventing dislocations or preventing deterioration in withstand voltage, and effects of these methods on gettering and the shape of OSF rings have remained unknown.

Thus, the present inventors have studied conditions for increasing the width of OSF rings and generating crystal defects attributed to the rings on the entire surface of a wafer, as well as for increasing the effectiveness of the gettering effect, and have found that when nitrogen serves as a single dopant and is doped in an amount of $1 \times 10^{18}$ atoms/cm$^3$ or more, nuclei of OSF are produced and diffused in an amount effective for attaining homogeneous gettering in a single crystal. In addition, when a Si epitaxial layer is formed on the surface of a slice obtained from the single crystal, there is produced a wafer having very few surface defects and exhibiting effective gettering action in a step for producing a device.

The concentration of nitrogen doped into a wafer is calculated from the amount of nitrogen doped in silicon before pulling; the distribution of nitrogen in a silicon melt and in solid; and the degree of solidification of the crystal. Briefly, the initial concentration of nitrogen in silicon, $C_0$, is calculated from the amount of silicon atoms in a raw material and the amount of nitrogen atoms added, and the concentration of nitrogen in the crystal $C_N$ is calculated by use of the following equation (a):

$$C_N = C_0 k (1-x)^{k-1} \qquad (a)$$

wherein k is the equilibrium segregation coefficient of nitrogen, which is $7 \times 10^{-4}$, and x is the degree of solidification, which is represented by the weight of the pulled portion of a crystal divided by an initial charge weight.

The above-described gettering method is particularly effective for wafers used in a p–, n–, or n+ device in which precipitate nuclei for forming sinks are easily extinguished by a step for forming an epitaxial layer. In addition, the method is also effective for a p+ wafer doped at high concentration with boron which getters Fe and effectively getters an element other than Fe.

The gettering effect for the epitaxial-layer-formed wafer is evaluated by MOS generation lifetime. The present inventors have conducted further, detailed investigation of wafers exhibiting excellent results among the thus-nitrogen-doped wafers, and have found that generation of OSF is observed at a density of $10^2/cm^2$ or more at a surface of substrate after a thermal oxidation treatment. Briefly, when a single crystal possesses defect nuclei, which produce OSF at a certain density or more through the thermal oxidation treatment, an excellent gettering effect may be attained.

The epitaxial layer is preferably formed on a wafer, which is heated to 1000° C. or higher. When a wafer sliced from a nitrogen-doped single crystal is heated to 1000° C. or higher, a temperature similar to that used for formation of the epitaxial layer, defects are observed at a density of $5\times10^4/cm^2$ or more in a cross-section. Such defects serve as sinks for gettering to thereby enhance the gettering effect of a wafer, and are obtained from defects nuclei generated in a single crystal by nitrogen doping.

However, a variety of device processes are carried out after an epitaxial process, and the history of the heat treatment of a wafer varies in accordance with the device processes, such as a low-temperature device process which is mainly carried out at a temperature of 800° C. or less, and a high-temperature device process which is mainly carried out at a temperature greater than 800° C. When a low-temperature device process is employed, oxide precipitate nuclei, which are not extinguished during an epitaxial process but remain thereafter, grow at a speed lower than that in the case of a high-temperature device process, to thereby yield insufficient gettering capability. In order to solve the problem, the present inventors have found that carbon or boron, which enhance the formation rate and the growth rate of oxide precipitates, is doped in addition to nitrogen even in a low-temperature device process, to thereby ensure excellent gettering capability.

The present invention has been accomplished based on this finding, and comprises three aspects, i.e., (1) a silicon single crystal, (2) a silicon wafer, and (3) an epitaxial wafer.

Accordingly, in aspect (1) of the present invention, there is provided a silicon single crystal suitable for production of an epitaxial wafer characterized in that the single crystal is grown with nitrogen doping at a concentration of $1\times10^{13}$ atoms/$cm^3$ or more, or with nitrogen doping at a concentration of $1\times10^{12}$ atoms/$cm^3$ and carbon doping at a concentration of $0.1\times10^{16}$–$5\times10^{16}$ atoms/$cm^3$ and/or boron doping at a concentration of $1\times10^{17}$ atoms/$cm^3$ or more.

In aspect (2) of the present invention, there is provided a silicon wafer that is produced by slicing the silicon single crystal described in aspect (1).

In aspect (3) of the present invention, there is provided an epitaxial wafer in which an epitaxial layer is grown on a surface of the silicon wafer described in aspect (2).

Preferably, the epitaxial wafer has an oxygen concentration of $12\times10^{17}$ atoms/$cm^3$ or more when the wafer is subjected to a device process carried out at 1100° C. or higher after epitaxial growth.

Preferably, the epitaxial wafer is characterized in that an epitaxial layer is grown on a surface of a single crystal wafer which is sliced from a silicon single crystal grown accompanied by nitrogen doping and generates OSF at a density of $1\times10^2/cm^2$ or more through a thermal oxidation treatment.

Preferably, the epitaxial wafer is characterized in that a single crystal wafer is sliced from a silicon single crystal grown accompanied by nitrogen doping and generates defects at a cross-sectional density of $5\times10^4/cm^2$ or more before epitaxial growth and the epitaxial wafer generates defects at a cross-sectional density of $1\times10^4/cm^2$ or more through a thermal treatment carried out at 1000° C. or higher.

Preferably, an epitaxial layer is grown on a silicon wafer which is sliced from a silicon single crystal grown accompanied by nitrogen doping at a concentration of $1\times10^{12}$ atoms/$cm^3$ or more when the epitaxial layer is subjected to a high-temperature device process carried out at a temperature substantially higher than 800° C. after epitaxial growth.

BRIEF DESCRIPTION OF THE DRAWING

Various other objects, features, and many of the attendant advantages of the present invention will be readily appreciated as the same becomes better understood with reference to the following detailed description of the preferred embodiments when considered in connection with an accompanying drawing, in which.

DESCRIPTION OF PREFERRED EMBODIMENTS

When a silicon single crystal is doped with only nitrogen, the nitrogen doping concentration is regulated to $1\times10^{13}$ atoms/$cm^3$ or more. When the concentration is less, the increase in the width of OSF rings is insufficient and sinks for gettering are not dispersed homogeneously. No particular upper limit is imposed on the doping concentration, and it is preferably about $4.5\times10^{15}$ atoms/$cm^3$, in that overdoping leads to easy formation of polycrystal.

When a wafer doped only with nitrogen is subjected to a low-temperature device process, growth of precipitate nuclei, which are not extinguished during an epitaxial process but remain afterward, is significantly suppressed. However, carbon or boron, which enhance formation rate and growth rate of oxide precipitates at low temperature, is doped in addition to nitrogen to thereby promote formation and growth of precipitate nuclei. In order to ensure the effect, nitrogen is doped at a concentration of $1 \times 10^{12}$ atoms/$cm^3$ and carbon is doped at a concentration of $0.1 \times 10^{16} - 5 \times 10^{16}$ atoms/$cm^3$ and/or boron is doped at a concentration of $1 \times 10^{17}$ atoms/$cm^3$ or more. No particular upper limit is imposed on the boron doping concentration, and it is preferably about $1 \times 10^{20}$ atoms/$cm^3$ in that doping at a very high concentration decreases the size of oxide precipitates to thereby cause deterioration of a gettering effect.

No particular limitation is imposed on the method for doping so long as doping at predetermined concentrations of nitrogen, carbon, and boron can be performed. Although several examples of a method for nitrogen doping have conventionally been known, examples herein include adding a nitride into a raw material or melt; incorporating a silicon crystal manufactured through a floating zone (FZ) method doped with nitrogen or silicon nitride film-coated wafer into a raw material; growing a single crystal in a furnace where nitrogen or a nitrogen compound gas flows; spraying nitrogen or a nitrogen compound to polycrystalline silicon at high temperature before melting; and making use of a crucible produced from nitride.

The above-described nitrogen-doped single crystal is sliced, and an epitaxial layer is formed on the polished and cleaned slice to thereby produce an epitaxial wafer. The method for forming an epitaxial layer is not particularly limited, and any method, such as thermal decomposition for vapor phase growth, may be employed so long as it can provide an epitaxial layer without crystal defects.

Thus, doping with nitrogen solely or with nitrogen and carbon and/or boron simultaneously enables homogeneous dispersion, throughout an entire wafer, of stable defects serving as sinks for gettering. The number of the defects depends on the content of oxygen or other impurity or on a condition for growing a single crystal. In an epitaxial wafer, since a device active region is limited, the wafer substrate must have a sufficient defect density.

The present inventors have investigated the number of defects from the above-described viewpoints, and have found that a wafer in which OSFs are produced at a surface density of $1 \times 10^2/cm^2$ or more due to a thermal oxidation treatment is suitably used, in view of attainment of a more stable gettering effect. The suitable number of defects may also be detected by observing a cross-section of a wafer after formation of an epitaxial layer. In this case, the number of defects observed is preferably $5 \times 10^4/cm^2$ or more after a heat treatment at $1000°$ C. or higher, which is preferable for growing an epitaxial layer. When a wafer is subjected to a device process involving a temperature of $1100°$ C. or higher, oxygen concentration is preferably $12 \times 10^{17}$ atoms/$cm^3$.

EXAMPLES

In order to clarify the effects of the present invention, examples will next be provided. Examples 1–3 are drawn to the case in which doping was carried out with nitrogen alone during growth of a single crystal, and Examples 4–6 are drawn to the case in which doping was carried out with nitrogen and carbon and/or boron during growth of a single crystal.

Example 1

According to the Czochralski method, a single crystal was grown in the following manner; i.e., highly pure poly-crystalline silicon (50 kg) was melted in a quartz crucible along with boron serving as a dopant, and the single crystal having a diameter of 150 mm and a crystal orientation of <100> was pulled at a pulling speed of 0.6 mm/min.

First, in order to clarify the effect of nitrogen, nitrogen gas was blown into the crucible at a rate of 10 l/min in order to increase nitrogen concentration in the crystal during the crystal growth step, when a single crystal was grown to a length of 300 mm below a shoulder. Next, in order to easily assume a nitrogen doping concentration, three grades of nitrogen-doped single crystals having respective doping concentrations of $10^{12}$ atoms/$cm^3$, $10^{13}$ atoms/$cm^3$, and $10^{14}$ atoms/$cm^3$ were grown by melting a silicon wafer having a silicon nitride layer possessing a predetermined nitrogen content together with highly pure poly-crystalline silicon serving as a raw material, while nitrogen gas was not blown while the crystal was pulled from the crucible.

Wafer specimens were sliced from the thus-obtained single crystal along the plane perpendicular to the crystal axis and subjected to heat oxidation in an oxygen atmosphere at $1100°$ C. for 16 hours. Thereafter, the specimens were subjected to selective etching in a wright etchant for 5 minutes, and OSF density was measured under an optical microscope.

Figure 1:
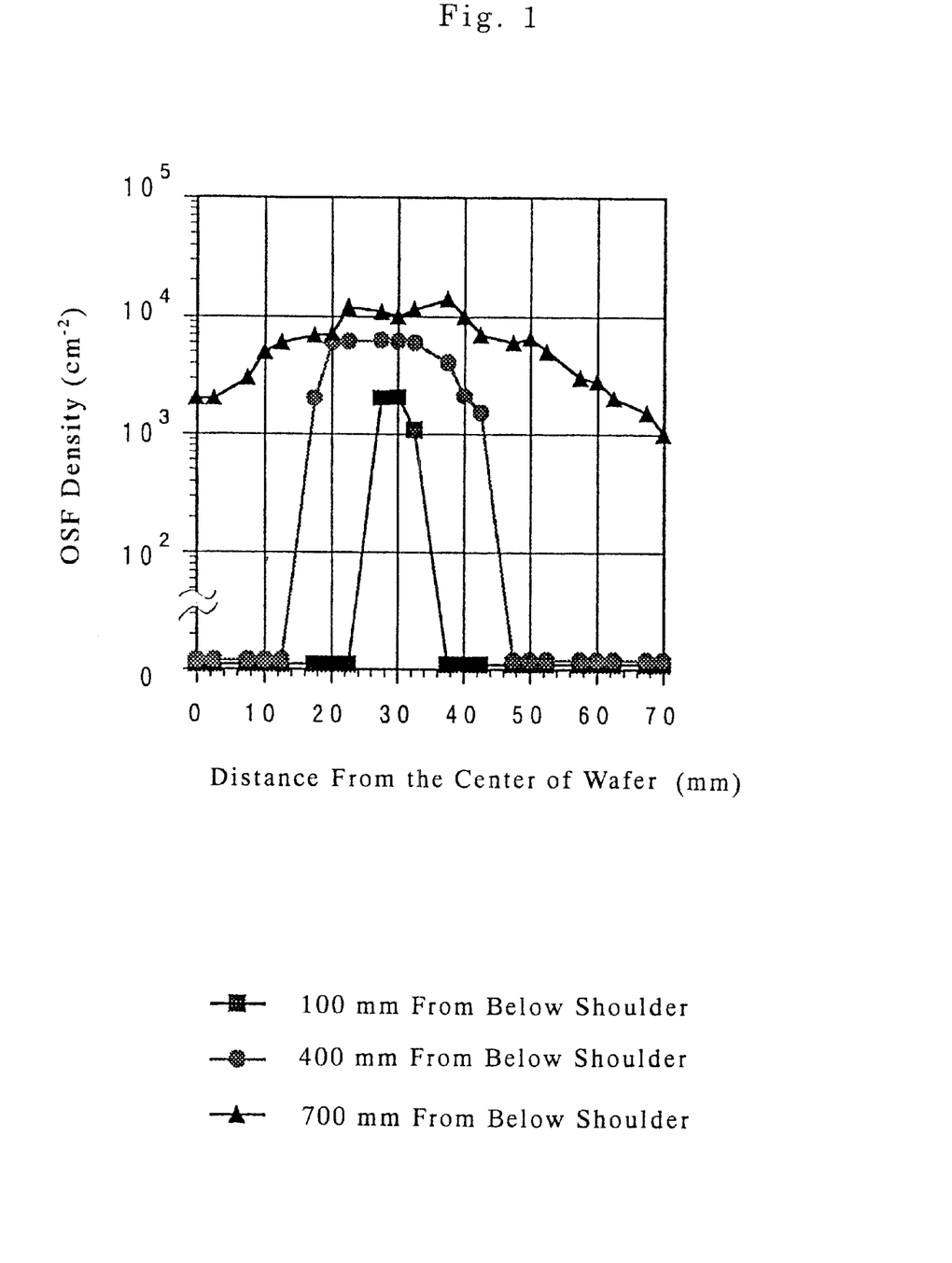
FIG. 1 shows changes in density distribution of OSF in a wafer with an increase in the concentration of nitrogen doping.

FIG. 1 shows distributions of OSF density in specimens at various locations of the pulled single crystal after nitrogen gas was doped at various doping concentrations. The figure indicates the distribution of OSF density at various radial distances from the center of the single crystal. In general, OSFs usually locate in a concentric ring zone centered on the axis of the crystal. The specimens at the distance of 100 mm below a shoulder are not doped with nitrogen, whereas at longer distances, e.g.; 400 mm and 700 mm below the shoulder, the nitrogen doping progresses, resulting in wider distribution of OSFs over the specimens and an increase in OSF density.

Figure 2:
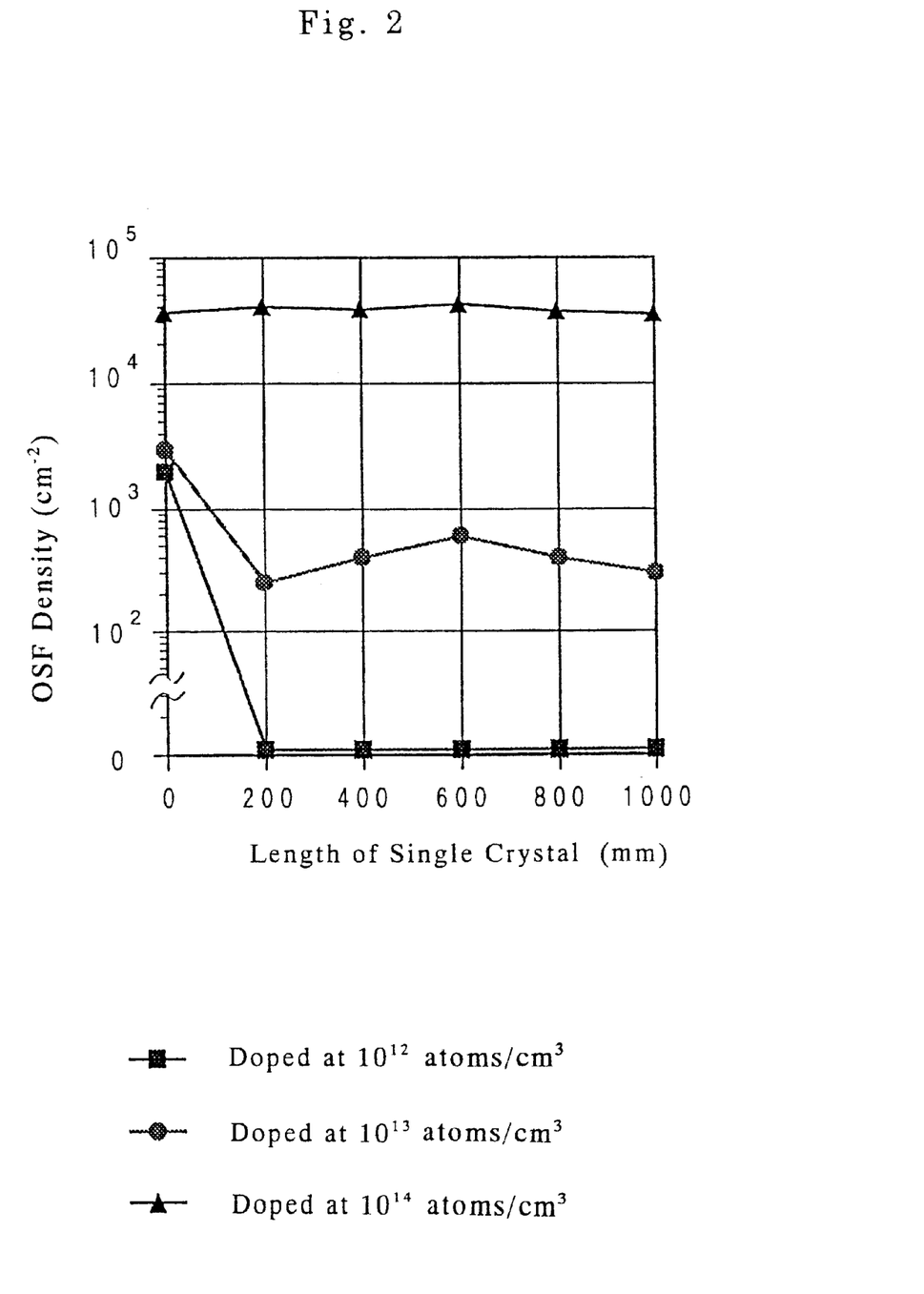
FIG. 2 shows that the density of OSF in a single crystal axis direction is enhanced and that the density distribution thereof becomes more uniform with an increase in the concentration of nitrogen doping.

FIG. 2 shows OSF density distributions at various lengths along the crystal growth axis at various nitrogen doping concentrations in the grown crystals. In the figure, the y-axis indicates average values of the OSF densities measured at various locations at radial intervals of 10 mm from the center of the crystal axis. As is clear from the figure, when the nitrogen doping concentration is $10^{12}$ atoms/$cm^3$, OSF density decreases with the progress of single crystal growth. However, when the nitrogen doping concentration is $10^{13}$ atoms/$cm^3$, OSF density decreases little to remain relatively high. When the nitrogen doping concentration is $10^{14}$ atoms/$cm^3$, OSF density remains high along the entire crystal growth axis and the distribution is uniform throughout the specimen.

Example 2

On the single crystal silicon wafer doped with nitrogen at a concentration of $10^{14}$ atoms/$cm^3$ in Example 1, an approximately 5-$\mu$m-thick epitaxial layer was formed at a deposition temperature of $1150°$ C. The thus-obtained wafer was then subjected to selective etching in a wright etchant for 5 minutes. The defect densities on the surface and the cross sections of the epitaxial layer were determined under an optical microscope.

Figure 3:
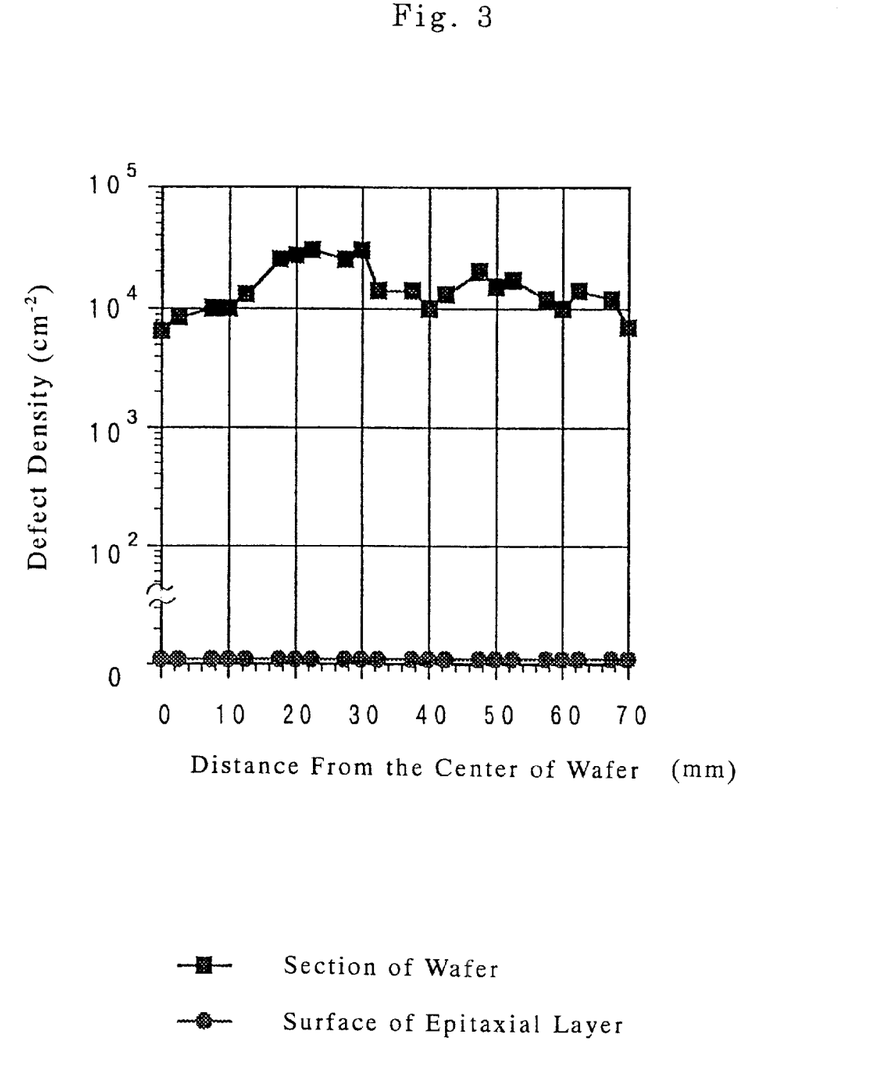
FIG. 3 shows crystal defect distribution both on the surface and within (along a cross-section) of an obtained epitaxial wafer.

FIG. 3 shows the defect densities on the surface and cross sections at various radial distances from the center of the specimens. After formation of the epitaxial layer, defects are present at a density of approximately $1 \times 10^4/cm^2$ along the cross sections of nitrogen-doped single crystal silicon wafer under the epitaxial layer. This indicates that oxide precipitates may not be diminished during formation of the epitaxial layer at high temperature. However, defects were observed on neither the surface nor the cross section of the epitaxial layer. It is confirmed that there is no growth of stacking faults in the underlayer single crystal portion into the epitaxial layer serving as an active region of a device.

Example 3

Nitrogen doping was carried out at respective concentrations of 0, $10^{12}$ atoms/cm$^3$, $10^{13}$ atoms/cm$^3$, and $10^{14}$, atoms/cm$^3$, on two types of wafer substrates; more specifically, on a wafer substrate having a high electric resistivity of 10 Ω·cm and on a wafer substrate having a low electric resistivity of 0.008 Ω·cm. From the thus-obtained eight types of single crystals, wafer substrates were sliced and subjected to deposition at 1150° C. to form an epitaxial layer having a thickness of approximately 5 μm.

These wafers were contaminated with a 3 ppm aqueous solution of Cu(NO$_3$)$_2$ by use of a spin coater, then subjected to a heat treatment in a dry oxygen atmosphere as a model treatment simulating the device production process, to thereby investigate the change in the gettering effect during heat treatment.

Figure 4:
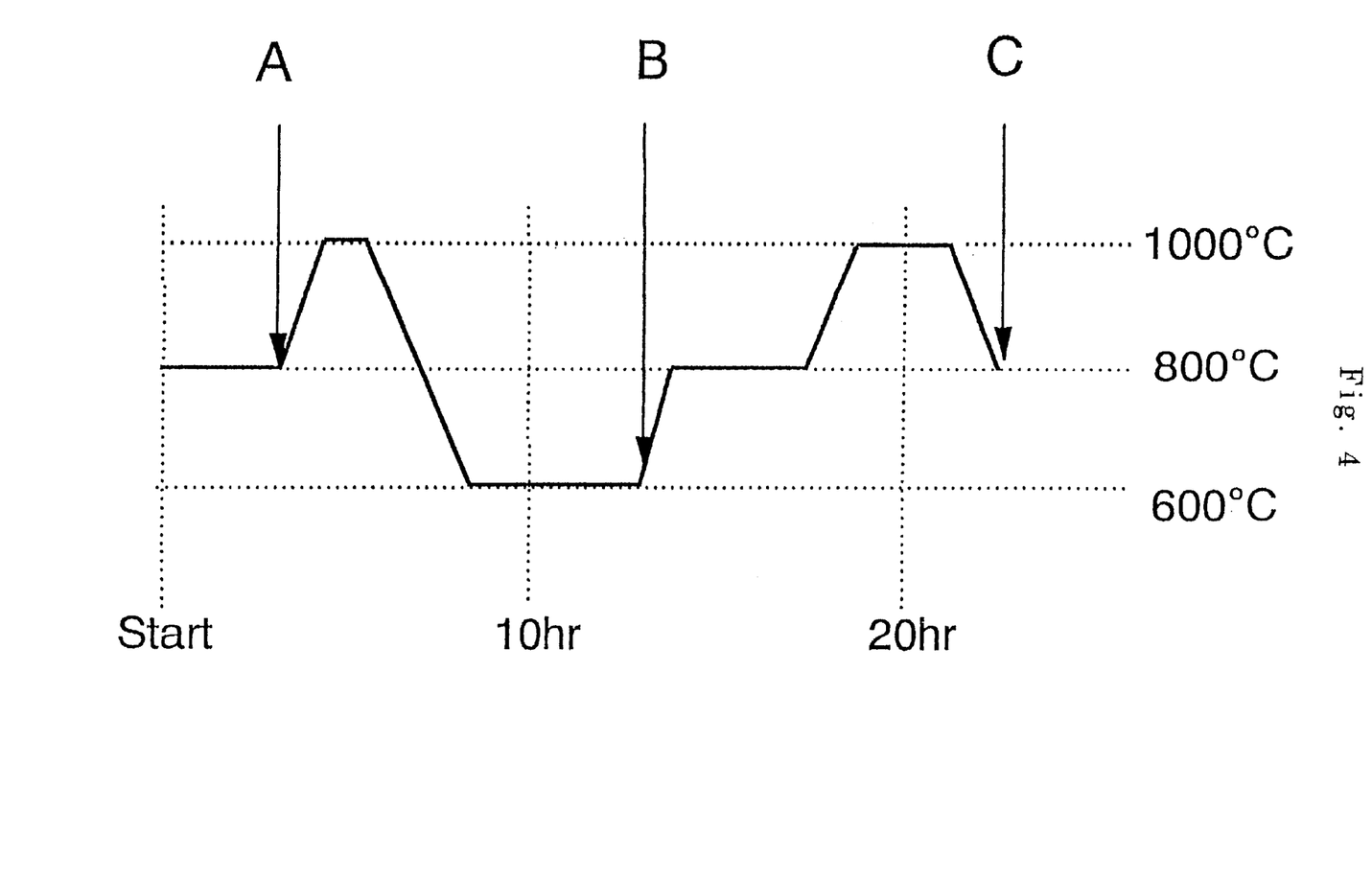
FIG. 4 shows a temperature profile pattern corresponding to steps for producing a device used in order to evaluate the gettering capability of a wafer.

FIG. 4 shows a temperature-time profile of the model heat treatment. At the three time points, A, B, and C in FIG. 4, the wafers were removed in order to determine a gettering effect corresponding to the progress of the treatment. The gettering effect was evaluated by the following steps: a thermally oxidized layer was removed by use of hydrofluoric acid; the treated wafer was oxidized in a dry oxygen atmosphere at 1000° C. for two hours to form a gate oxide film having a thickness of approximately 75 nm; an Al film having a thickness of 500 nm was deposited on the wafer through vapor deposition; the Al-coated wafer was sintered at 450° C. for 30 minutes to thereby produce a gate electrode having a guard electrode and a size of 1 mm×1 mm; and MOS generation lifetime was measured.

Figure 5:
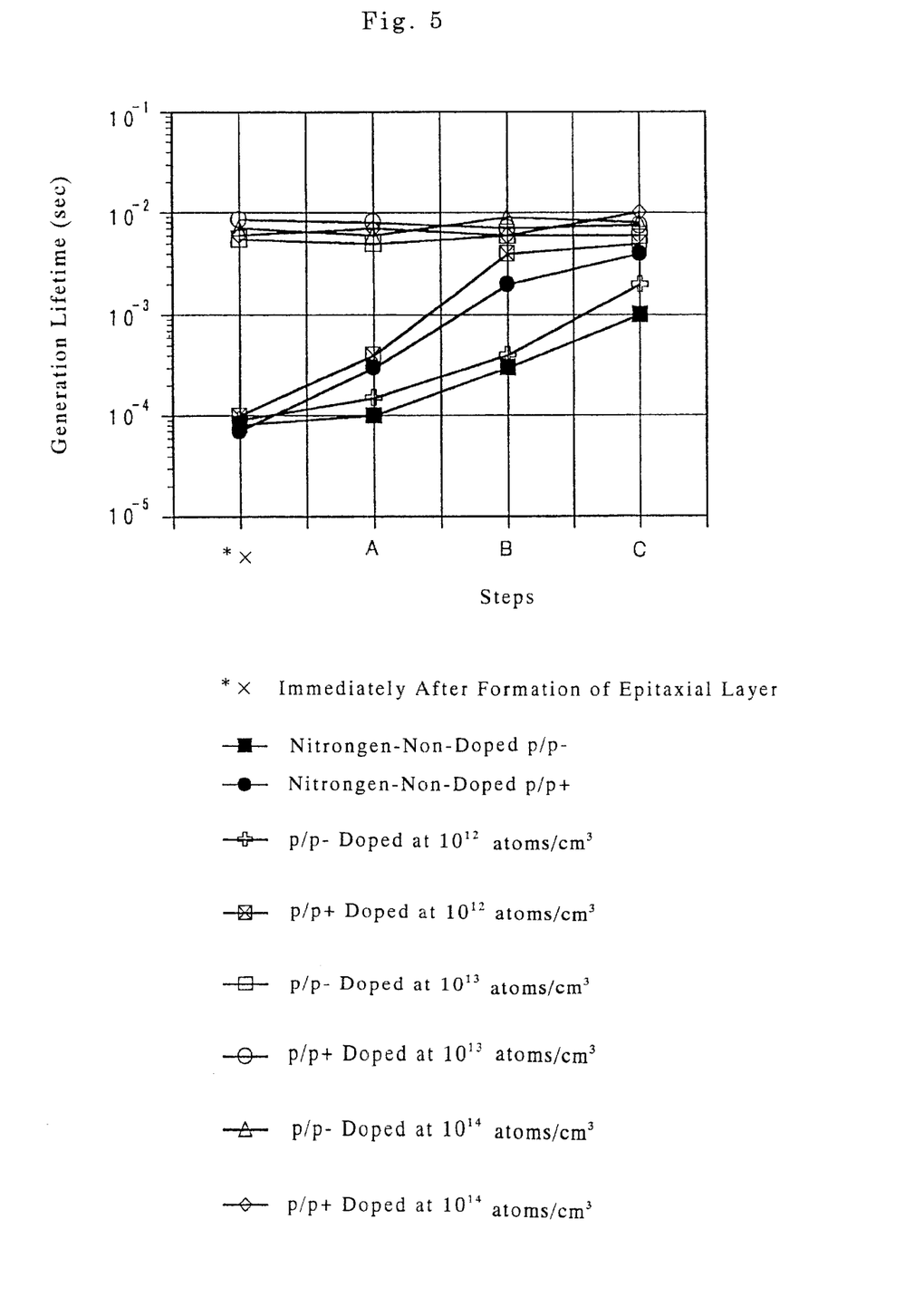
FIG. 5 shows changes in MOS generation lifetime for production of wafers having a variety of nitrogen doping concentrations.

FIG. 5 shows the results of measurement of MOS generation lifetime. Wafers, which had not been doped with nitrogen, exhibited a short lifetime, which was determined immediately after formation of an epitaxial layer. Although the lifetime became longer with the progress of the heat treatment, it was still insufficient. On the other hand, wafers of single crystals doped with nitrogen at a concentration of $10^{13}$ atoms/cm$^3$ and those doped with nitrogen at a concentration of $10^{14}$ atoms/cm$^3$ consistently exhibited a long lifetime of MOS through the device production process. Wafers doped with nitrogen at a concentration of $10^{12}$ atoms/cm$^3$ exhibited values similar to those of non-doped wafers. In contrast, as shown in FIG. 2 of Example 1, a wafer doped with nitrogen at a concentration of $10^{13}$ atoms/cm$^3$ exhibited almost the same gettering effect as that of a wafer doped at a concentration of $10^{14}$ atoms/cm$^3$; nevertheless, the OSF density of a wafer doped at a concentration of $10^{13}$ atoms/cm$^3$ was lower than that of a wafer doped at a concentration of $10^{14}$ atoms/cm$^3$. Doping at a concentration of $10^{13}$ atoms/cm$^3$ or more can presumably form sufficient sinks for gettering. Moreover, no significant difference in gettering effect between p/p$^-$ and p/p$^+$ was observed. Therefore, the gettering effect of the epitaxial wafer, which was obtained by nitrogen doping, is clearly independent of the electrical resistance of the wafer.

Example 4

In Example 4, defect densities along cross sections were evaluated for silicon wafers prepared from silicon single crystals having various nitrogen doping concentrations, as well as for the wafers subjected to an epitaxial growth treatment. In order to clarify the effect of nitrogen doping, silicon wafers having resistivities of 10 Ω·cm and 0.05 Ω·cm which were doped with nitrogen at concentrations of 3×10$^{12}$ atoms/cm$^3$ and 5×10$^{13}$ atoms/cm$^3$ were prepared in order to serve as specimens for Examples of the present invention, and silicon wafers having a resistivity of 10 Ω·cm and doped with nitrogen concentrations of 0 atoms/cm$^3$ and 8×10$^{11}$ atoms/cm$^3$ were prepared in order to serve as specimens for Comparative Examples.

Furthermore, in order to confirm the effect of simultaneous doping with nitrogen and carbon and/or boron, silicon wafers doped with nitrogen and carbon; silicon wafers doped with nitrogen and boron; and silicon wafers doped with nitrogen, carbon, and boron at predetermined concentrations were prepared and served as specimens for Examples of the present invention. The features of wafer levels for these wafers for Examples and Comparative Examples of the present invention are shown in Table 1.

TABLE 1

| Wafer Level | Doping Concentration (atoms/cm$^3$) | | | Note (Example) |
|---|---|---|---|---|
| | Nitrogen | Carbon | Boron | |
| 1 | 0 | — | 1.3 × 10$^{15}$ | Comparative Example |
| 2 | 8 × 10$^{11}$ | — | 1.3 × 10$^{15}$ | Comparative Example |
| 3 | 3 × 10$^{12}$ | — | 1.3 × 10$^{15}$ | Present Invention |
| 4 | 5 × 10$^{13}$ | — | 1.3 × 10$^{15}$ | Present Invention |
| 5 | 3 × 10$^{12}$ | 3 × 10$^{16}$ | 1.3 × 10$^{15}$ | Present Invention |
| 6 | 5 × 10$^{13}$ | 3 × 10$^{16}$ | 1.3 × 10$^{15}$ | Present Invention |
| 7 | 3 × 10$^{12}$ | — | 8 × 10$^{17}$ | Present Invention |
| 8 | 5 × 10$^{13}$ | — | 8 × 10$^{17}$ | Present Invention |
| 9 | 3 × 10$^{12}$ | 3 × 10$^{16}$ | 8 × 10$^{17}$ | Present Invention |
| 10 | 5 × 10$^{13}$ | 3 × 10$^{16}$ | 8 × 10$^{17}$ | Present Invention |

The thus-prepared silicon wafer specimens were subjected to an epitaxial growth treatment carried out at a deposition temperature of 1150° C. to form an epitaxial layer having a thickness of approximately 5 μm. Subsequently, the wafers were heated at 1000° C. for 16 hours in an oxygen atmosphere. The thus-obtained specimens were subjected to selective etching in a wright etchant for 5 minutes, and the cross-sectional defect densities of the epitaxial wafers and silicon wafers were measured under an optical microscope.

Figure 6:
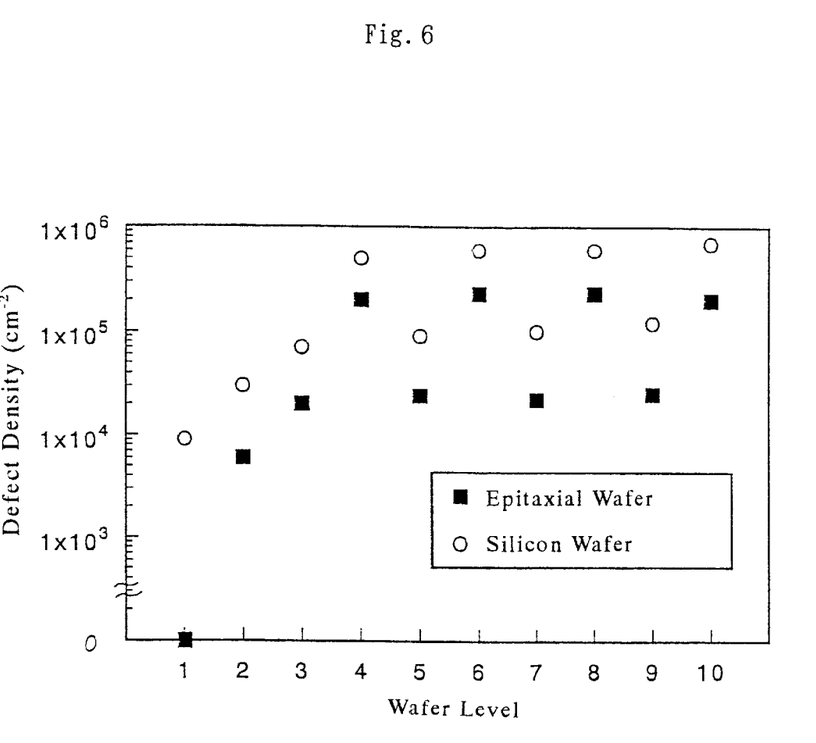
FIG. 6 shows defect densities in a cross-section of wafers before and after epitaxial growth as measured in Example 4.

FIG. 6 shows the defect densities along cross sections of the wafers before and after epitaxial growth treatment. As is clear from FIG. 6, the wafer, which had not been doped with nitrogen (wafer level 1), has no defects, whereas the nitrogen-doped wafers have defects. The nitrogen-doped wafers have defects along cross sections of a layer under the epitaxial layer, and the defect density increases with nitrogen concentration. On the basis of the results, it is assumed that in the non-doped wafer, precipitates nuclei which formed during growth of the single crystal were extinguished and could not grow during heat treatment at 1000° C., whereas in the nitrogen-doped wafers, oxygen precipitates formed during growth of the single crystal became difficult to extinguish and became large to an observable size through heat treatment at 1000° C.

When the wafers were doped with nitrogen and carbon and/or boron, the defect densities were almost the same as those of wafers doped solely with nitrogen. Although Example 4 used wafers whose oxygen concentrations were modified within the range of 11×10$^{17}$–15×10$^{17}$ atoms/cm$^3$, defect density exhibited no dependence on oxygen concentration. Therefore, when a heat treatment is carried out at 1000° C. as in Example 4, defect density is not dependent on oxygen concentration.

Furthermore, it is apparent that the defect density can be determined from the density of doped nitrogen, so long as an experiment is carried out under the same conditions as those of Example 4. A wafer having a high nitrogen concentration is suitable, in view of a gettering effect. A target defect density along a cross section of epitaxial wafers after a heat treatment at 1000° C. is $1\times10^4/cm^2$ or more. When heat treatment at 1000° C. is carried out before epitaxial growth, the target defect density is $5\times10^4/cm^2$ or more.

The quality of the epitaxial layers is confirmed. That is, no defects were observed on a surface or along cross sections of the epitaxial layers, and no growth of defects was observed from a single crystal portion in a layer under the epitaxial layer into the epitaxial layer serving as an active region of a device.

Example 5

In Example 5, high-temperature heat treatment was carried out in order to clarify the effect of high-temperature heat treatment on defect density. Wafer levels are same as those in Table 1. Thus, a wafer containing oxygen at a concentration of $11\times10^{17}$ atoms/cm$^3$ and a wafer containing oxygen at a concentration of $14\times10^{17}$ atoms/cm$^3$ were prepared. The wafers were subjected to an epitaxial growth treatment at a deposition temperature of 1150° C. to thereby obtain an epitaxial layer having a thickness of approximately 5 μm. Thereafter, the treated wafers were treated at a temperature higher than that of Example 4; i.e., at 1100° C., for 16 hours in an oxygen atmosphere. The thus-obtained wafers were subjected to selective etching in a wright etchant to thereby measure the defect density along cross sections of epitaxial and silicon wafers.

Figure 7:
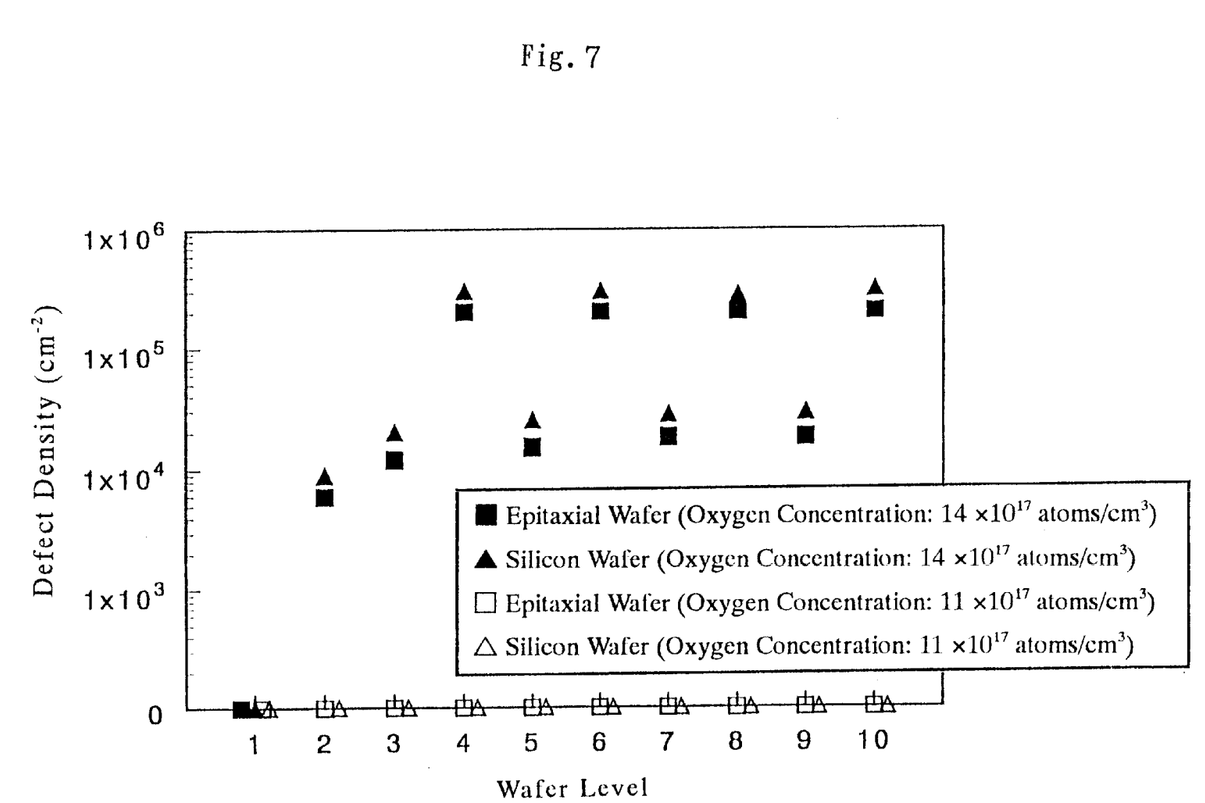
FIG. 7 shows defect densities in a cross-section of wafers before and after epitaxial growth as measured in Example 5.

FIG. 7 shows the defect density along cross sections of wafers before and after an epitaxial growth treatment. As shown in FIG. 7, no defects were observed on the wafers containing oxygen at a concentration of $11\times10^{17}$ atoms/cm$^3$ for all wafer levels, whereas defects at densities of $1\times10^4/cm^2$ or more were observed along the cross sections of both epitaxial and silicon wafers when the oxygen concentration of wafers was $14\times10^{17}$ atoms/cm$^3$. Defect densities were also investigated for wafers having other oxygen concentrations. It is confirmed that defect density of $1\times10^4/cm^2$ or more is observed when oxygen concentration is $12\times10^{17}$ atoms/cm$^3$ or more.

As is clear from FIG. 7, preferably, the higher the temperature used in a device process, the higher the oxygen concentration. Specifically, when a device process is carried out at 1100° C. or higher, a wafer having an oxygen concentration of $12\times10^{17}$ atoms/cm$^3$ or higher is preferably employed.

Example 6

In Example 6, a gettering effect was evaluated by use of the same wafers as used in Example 4. Thus, an epitaxial growth treatment was carried out under the same conditions as in Example 4. The resultant epitaxial wafers were subjected to a high-temperature process substantially involving a temperature of greater of 800° C., or by a low-temperature process mainly involving a temperature of 800° C. or lower. Wafer levels of the wafers employed for the above-described high and low temperature processes are shown in Table 2.

TABLE 2

| Wafer Level | Device Process | Doping Concentration (atoms/cm³) | | | Note (Example) |
|---|---|---|---|---|---|
| | | Nitrogen | Carbon | Boron | |
| 1 | High-temperature process | 0 | — | $1.3 \times 10^{15}$ | Comparative Example |
| 2 | | | | | |
| 3 | | $8 \times 10^{11}$ | — | $1.3 \times 10^{15}$ | Comparative Example |
| 4 | | | | | |
| | | $3 \times 10^{12}$ | — | $1.3 \times 10^{15}$ | Present Invention |
| | | $5 \times 10^{13}$ | — | $1.3 \times 10^{15}$ | Present Invention |
| 5 | Low-temperature process | 0 | — | $1.3 \times 10^{15}$ | Comparative Example |
| 6 | | $8 \times 10^{11}$ | — | $1.3 \times 10^{15}$ | Comparative Example |
| 7 | | $3 \times 10^{12}$ | — | $1.3 \times 10^{15}$ | Present Invention |
| 8 | | $5 \times 10^{13}$ | — | $1.3 \times 10^{15}$ | Present Invention |
| 9 | | $3 \times 10^{12}$ | $3 \times 10^{16}$ | $1.3 \times 10^{15}$ | Present Invention |
| 10 | | $5 \times 10^{13}$ | $3 \times 10^{16}$ | $1.3 \times 10^{15}$ | Present Invention |
| 11 | | $3 \times 10^{12}$ | — | $8 \times 10^{17}$ | Present Invention |
| 12 | | $5 \times 10^{13}$ | — | $8 \times 10^{17}$ | Present Invention |
| 13 | | $3 \times 10^{12}$ | $3 \times 10^{16}$ | $8 \times 10^{17}$ | Present Invention |
| 14 | | $5 \times 10^{13}$ | $3 \times 10^{16}$ | $8 \times 10^{17}$ | Present Invention |

Subsequently, thermal oxide film formed on the heat-treated wafers was removed by hydrofluoric acid, and the wafer surface was contaminated with $10^{12}/cm^2$ of Ni, which was diffused into the wafer through heat treatment at 1000° C. for one hour. Thereafter, the wafers were oxidized at 950° C. for 40 minutes in a dry oxygen atmosphere, to thereby form a gate oxide film having a thickness of 25 nm thereon. A poly-silicon film having a thickness of 400 nm was formed through CVD on the gate oxide film, and doped with phosphorus through a vapor phase diffusion method, to thereby serve as an electrode. The wafer surface was patternwise divided into areas of 8 mm$^2$, and gettering effect was evaluated based on the yield of gate oxide integrity.

Figure 8:
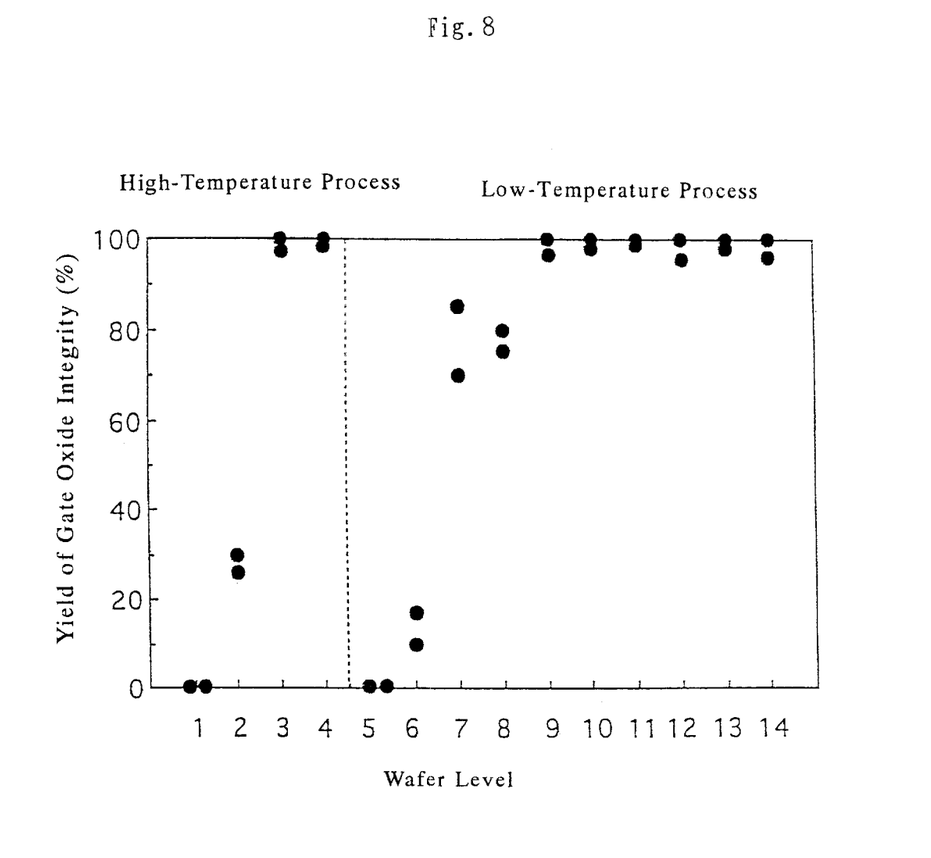
FIG. 8 shows yield of gate oxide integrity.

FIG. 8 shows yield of gate oxide integrity as measured in Example 6. When wafers were subjected to a high-temperature process, all the wafers doped in the manner according to the present invention; i.e., with nitrogen at a concentration of $1\times10^{12}$ atoms/cm$^3$ or more, exhibited yield of approximately 100%. In contrast, wafers of the Comparative Examples exhibited poor ratio of 0–30%. The results indicate that wafers doped with nitrogen at a concentration of $1\times10^{12}$ atoms/cm$^3$ or more exhibit an excellent gettering effect to a high-temperature process.

Meanwhile, when wafers were subjected to a low-temperature process, the yield obtained in the Comparative Examples was about 0–20%. In contrast, wafers doped with nitrogen at a concentration of $1\times10^{12}$ atoms/cm$^3$ or more showed yield of approximately 80% among the wafers obtained in the Examples. Furthermore, wafers doped simultaneously with nitrogen and carbon and/or boron showed yield of approximately 100%. These results indicate that wafers doped with nitrogen a concentration of $1\times10^{12}$ atoms/cm$^3$ or more, as specified by the present invention, exhibit an excellent gettering effect to a low-temperature process as compared with the non-doped wafers of the Comparative Examples. However, the gettering effect is slightly inferior to that obtained by simultaneous doping with nitrogen and carbon and/or boron.

The higher the density of oxide precipitates, the more effective the gettering. However, growth of oxide precipitates is suppressed during a low-temperature process. Consequently, the wafers of the Comparative Examples (wafer levels 5 and 6) have a defect density of $10^3/cm^2$ or less, and the wafers doped with nitrogen at a concentration of $1\times10^{12}$ atoms/cm$^3$ or more (wafer levels 7 and 8) have a defect density of approximately $10^5/cm^2$, while the wafers (wafer levels 9 through 14) have a defect density of $10^6/cm^2$ or more. The difference in defect density reflects the gettering effect and is attributed to the presence of carbon and boron, which have an effect for enhancing the density of oxide precipitates during a low-temperature process at 800° C. or lower.

As apparent from Example 6, the wafers according to the present invention that are doped with nitrogen at a concentration of $1\times10^{12}$ atoms/cm³ or more have a gettering effect in a high-temperature process more excellent than that of conventional wafers. Furthermore, the wafers according to the present invention that are doped simultaneously with nitrogen and carbon and/or boron also have an excellent gettering effect during a low-temperature process.

As described hereinabove, the silicon single crystal, silicon wafer, and epitaxial wafer according to the present invention provide a stable gettering effect during any device process involving any temperature profile, by forming oxide precipitates which are not extinguished even during a high-temperature epitaxial process without performance of an extrinsic or intrinsic gettering treatment, which is a factor for increasing costs.

What is claimed is:

1. A silicon single crystal suitable for production of an epitaxial wafer wherein the single crystal is grown with nitrogen doping at a concentration of $1\times10^{12}$ atoms/cm³ or more and carbon doping at a concentration of $0.1\times10^{16}$–$5\times10^{16}$ atoms/cm³.

2. A silicon wafer, which is produced by slicing a silicon single crystal as described in claim 1.

3. An epitaxial wafer, which is produced without extrinsic gettering treatment, and in which an epitaxial layer is grown on a surface of a silicon wafer as described in claim 2.

4. An epitaxial wafer according to claim 3, which has an oxygen concentration of $12\times10^{17}$ atoms/cm³ or more when the wafer is subjected to a device process carried out at 1100° C. or higher after epitaxial growth.

5. A silicon single crystal suitable for production of an epitaxial wafer wherein the single crystal is grown with nitrogen doping at a concentration of $1\times10^{12}$ atoms/cm³ or more and boron doping at a concentration of $1\times10^{17}$ atoms/cm³ or more.

6. A silicon wafer, which is produced by slicing a silicon single crystal as described in claim 5.

7. An epitaxial wafer, which is produced without extrinsic gettering treatment, in which an epitaxial layer is grown on a surface of a silicon wafer as described in claim 6.

8. An epitaxial wafer according to claim 7, which has an oxygen concentration of $12\times10^{17}$ atoms/cm³ or more when the wafer is subjected to a device process carried out at 1100° C. or higher after epitaxial growth.

9. A silicon single crystal suitable for production of an epitaxial wafer wherein the single crystal is grown with nitrogen doping at a concentration of $1\times10^{12}$ atoms/cm³ or more, carbon doping at a concentration of $0.1\times10^{16}$–$5\times10^{16}$ atoms/cm³ and boron doping at a concentration of $1\times10^{17}$ atoms/cm³ or more.

10. A silicon wafer, which is produced by slicing a silicon single crystal as described in claim 9.

11. An epitaxial wafer, which is produced without extrinsic gettering treatment, in which an epitaxial layer is grown on a surface of a silicon wafer as described in claim 10.

12. An epitaxial wafer, which is produced without extrinsic gettering treatment according to claim 7, which has an oxygen concentration of $12\times10^{17}$ atoms/cm³ or more when the wafer is subjected to a device process carried out at 1100° C. or higher after epitaxial growth.

* * * * *